US006727746B2

(12) United States Patent
Madni et al.

(10) Patent No.: US 6,727,746 B2
(45) Date of Patent: Apr. 27, 2004

(54) RADIO FREQUENCY AMPLIFIER AND TELEVISION TUNER

(75) Inventors: Arshad Madni, Swindon (GB); Franco Lauria, Swindon (GB); Mark Stephen John Mudd, Swindon (GB); Lance Rhys Trodd, Swindon (GB); Nicholas Paul Cowley, Wroughton (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 10/225,790

(22) Filed: Aug. 22, 2002

(65) Prior Publication Data

US 2003/0052736 A1 Mar. 20, 2003

(30) Foreign Application Priority Data

Sep. 1, 2001 (GB) .............................................. 0121216

(51) Int. Cl.⁷ ................................................. H03F 3/45
(52) U.S. Cl. ...................................... 327/560; 327/252
(58) Field of Search ................................ 327/560, 561, 327/562, 563, 355; 330/254, 252, 261, 253, 305

(56) References Cited

U.S. PATENT DOCUMENTS

| 4,498,053 | A | | 2/1985 | Katakura et al. | ............ 330/261 |
| 5,371,475 | A | * | 12/1994 | Brown | ........................ 330/252 |
| 5,420,538 | A | * | 5/1995 | Brown | ........................ 330/252 |

FOREIGN PATENT DOCUMENTS

| GB | 1075436 | 7/1967 |
| GB | 1372240 | 10/1974 |
| WO | 95/01049 | 1/1995 |

* cited by examiner

Primary Examiner—Dinh T. Le
(74) Attorney, Agent, or Firm—Thompson Hine LLP

(57) ABSTRACT

A radio frequency amplifier including a long tail pair of transistors provided with a tail current source. The bases of the transistors are driven by emitter follower transistor provided with collector load resistors. Feedback capacitors ensure stability and feedback resistors bias the amplifier without degrading noise performance. The amplifier may be driven unbalanced while retaining good second harmonic distortion performance.

8 Claims, 4 Drawing Sheets

RADIO FREQUENCY AMPLIFIER AND TELEVISION TUNER

BACKGROUND

The present invention relates to a radio frequency amplifier and to a television tuner including such an amplifier.

It is a requirement, for example in cable and terrestrial television tuners, to provide a front end having a high intermodulation distortion performance (such as IIP3 and IIP2) and a low noise figure. FIG. 1 of the accompanying drawings illustrates a known example of a radio frequency amplifier formed in an integrated circuit and comprising a long tail pair of first and second transistors 1 and 2 whose collectors are connected to a Gilbert cell 3 forming a mixer or a current steering stage to provide automatic gain control (AGC). The bases of the first and second transistors 1 and 2 are connected to first and second differential or balanced inputs IN+ and IN− and via resistors 4 and 5 to a bias voltage Vbias 2. The emitters of the transistors 1 and 2 are connected via emitter resistors 6 and 7, respectively, to a tail current source, which comprises a transistor 8 whose base is connected to a bias voltage Vbias 1 and whose emitter is connected via a resistor 9 to ground. The Gilbert cell 3 is provided with load resistors 10 and 11 connected to a supply line VCC.

When used as the first stage of, for example, a television tuner, the input signal is supplied to the first input IN+ via a coupling capacitor and the second input IN− is grounded via a capacitor 12. The long tail pair converts the input voltage to a differential current emerging from the collectors of the transistors 1 and 2, which current drives the Gilbert cell 3.

The emitter resistors 6 and 7 have the same resistance. In order to maximise the signal handling of the amplifier, the product of the resistance of each of the emitter resistors 6 and 7 and the direct current flowing through each of the resistors has to be maximised. This also reduces the third harmonic distortion in the signal current emerging from the collectors of the transistors 1 and 2. However, because the amplifier is driven in an unbalanced mode with the signal voltage being supplied to the first input IN+ and the second input IN− being grounded at signal frequencies, the amplifier exhibits some residual second harmonic distortion, which is a function of the impedance of a source connected to the first input IN+ and a complex function of transistor parameters.

In order to avoid this problem, the amplifier inputs may be driven differentially as shown in FIG. 2 of the accompanying drawings. An external transformer 15 has a primary winding with one end connected to receive the input signal and the other end grounded and a secondary winding connected between the bases of the transistors 1 and 2. Although this improves the second harmonic distortion performance of the amplifier, the transformer 15 is a relatively large and costly item and has to be provided externally of the integrated circuit.

GB 1 372 240 discloses an arrangement for controlling the line oscillator frequency in a television receiver. Part of the circuit comprises Darlington pairs of transistors connected as a long tail pair.

GB 1 075 436 discloses a unity gain buffer amplifier intended for audio frequencies and based on Darlington transistors connected as a long tail pair.

WO 95/01049 discloses a television IF amplifying arrangement which includes a long tail pair of transistors whose bases are driven by the emitters of another long tail pair. Both long tail pairs have emitter degeneration resistors and a common current source.

U.S. Pat. No. 4,498,053 discloses a current amplifier for use in an audio noise reduction system. The circuit includes a long tail pair of transistors driven by the emitters of two further transistors.

SUMMARY

According to a first aspect of the invention, there is provided a radio frequency amplifier comprising a long tail pair of first and second transistors, a third transistor whose base is connected to a first input of the amplifier and whose emitter is connected to the base of the first transistor, and a fourth transistor whose base is connected to a second input of the amplifier and whose emitter is connected to the base of the second transistor, the third and fourth transistors having first and second collector resistors, respectively.

The first and second transistors may have first and second emitter resistors, respectively.

The long tail pair may comprise a common current source for the emitters of the first and second transistors.

The third and fourth transistors may have third and fourth emitter resistors, respectively.

The amplifier may comprise first and second capacitors connected between the bases and collectors of the third and fourth transistors, respectively.

The amplifier may comprise first and second feedback resistors connected between the bases and collectors of the third and fourth transistors, respectively.

The second input of the amplifier may be connected to ground via a third capacitor.

The collectors of the first and second transistors may be connected to a Gilbert cell.

According to a second aspect of the invention, there is provided a television tuner comprising an amplifier according to the first aspect of the invention.

It is thus possible to provide an amplifier having good signal handling ability and intermodulation distortion performance while maintaining a low noise figure. Such an amplifier may be used as or in the front end of a television tuner, for example feeding a mixer or automatic gain control stage.

BRIEF DESCRIPTION OF DRAWINGS

The invention will be further described, by way of example, with reference to the accompanying drawings, in which.

Like reference numerals refer to like parts throughout the drawings.

DETAILED DESCRIPTION

Figure 1:
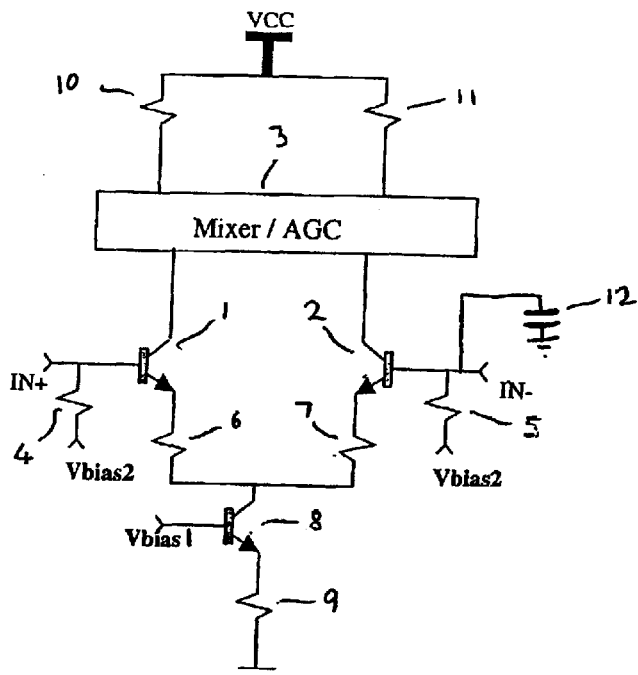
FIG. 1 is a circuit diagram of a known radio frequency amplifier.
Figure 2:
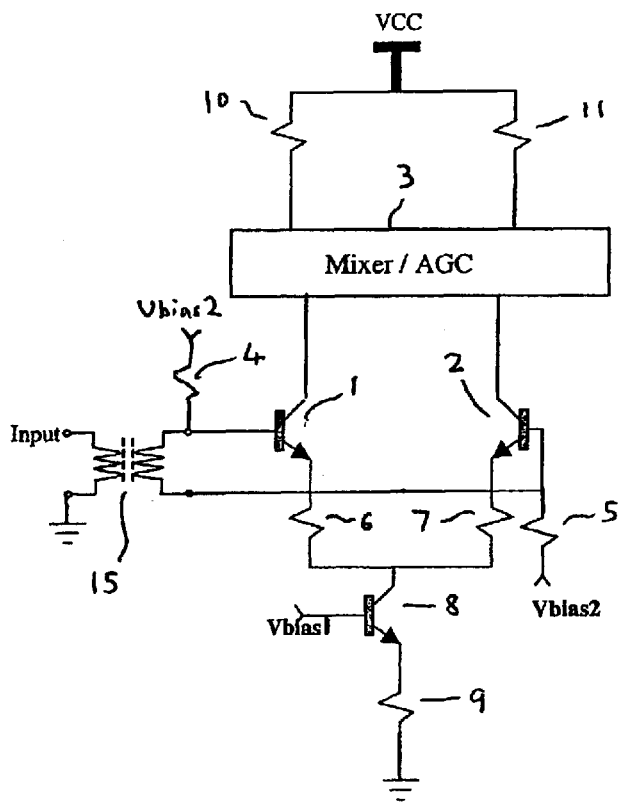
FIG. 2 is a circuit diagram of another known radio frequency amplifier.
Figure 3:
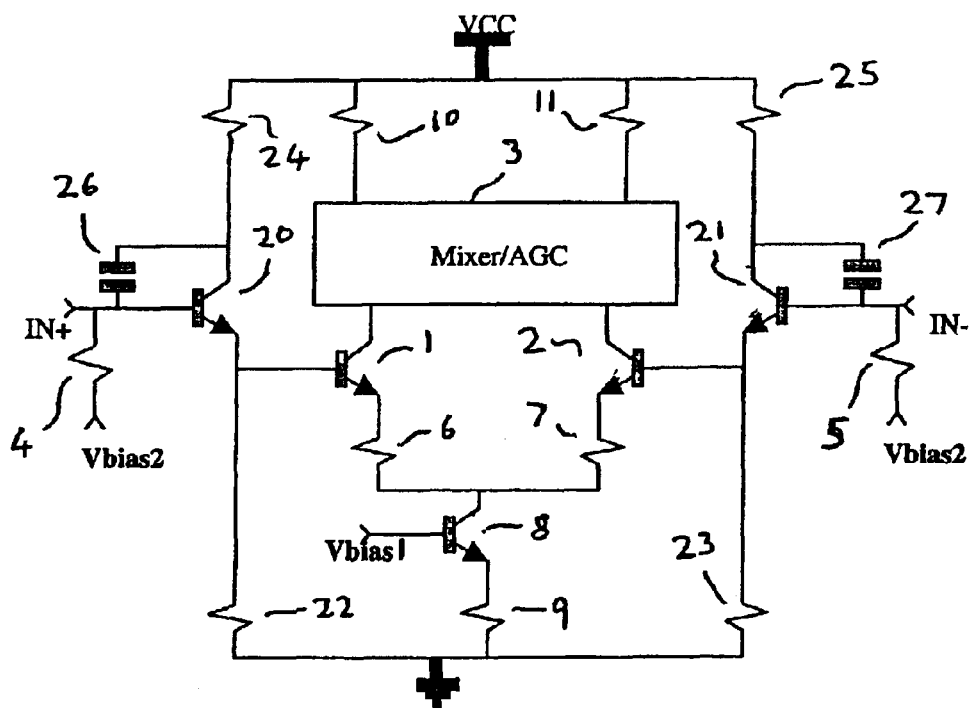
FIG. 3 is a circuit diagram of a radio frequency amplifier constituting a first embodiment of the invention.

The radio frequency amplifier shown in FIG. 3 comprises a long tail pair of transistors 1 and 2 driving a Gilbert cell 3 of the same type as shown in FIGS. 1 and 2. However, the amplifier differs from the amplifier shown in FIG. 1 in that the bases of the transistors 1 and 2 are driven by emitter followers comprising transistors 20 and 21.

The emitters of the transistors 20 and 21 are connected to the bases of the transistors 1 and 2, respectively, and via emitter resistors 22 and 23, respectively, to ground. The bases of the transistors 21 and 22 are connected to the first and second inputs IN+ and IN−, respectively, and via the resistors 4 and 5, respectively, to the bias voltage Vbias 2. The collectors of the transistors 20 and 21 are connected via collector resistors 24 and 25, respectively, to the supply line VCC. Each of the transistors 20 and 21 has a capacitor 26, 27 connected between the base and collector thereof.

The resistors 24 and 25 and the capacitors 26 and 27 form compensation networks ensuring the stability of the amplifier. If these components where not present, the real part of the net input impedance appearing at the bases of the transistors 20 and 21 would be negative at high frequencies. The inclusion of the resistors 24 and 25 and the capacitors 26 and 27 adds a time constant which has effect at a frequency lower than the point where negative resistance would occur so as to ensure that the real part of the input impedance is always positive.

The presence of the emitter followers improves the second harmonic distortion performance of the amplifier when it is driven from an unbalanced source (with the second input IN− grounded at signal frequencies by the capacitor 12 as shown in FIG. 1). The emitter followers can readily be integrated with the remainder of the amplifier so that the space and cost of an external transformer can be avoided while providing a performance which is substantially the same as can be achieved by a balanced input signal.

Figure 4:
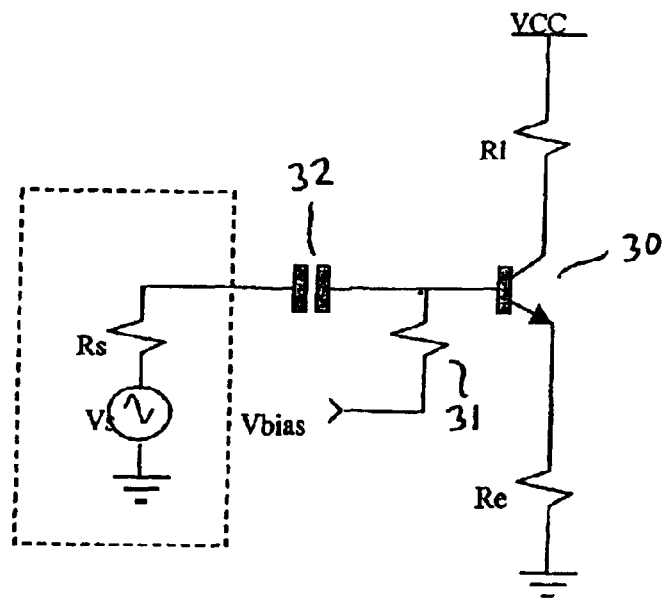
FIGS. 4, 5 and 6 are circuit diagrams illustrating aspects of operation of embodiments of the invention.

The presence of the emitter followers also reduces the base current shot noise of the transistors 1 and 2. To illustrate this, FIG. 4 is a circuit diagram of a common emitter amplifier comprising a transistor 30 provided with a collector load resistor having a value Rl, an emitter resistor having a value Re, and a resistor 31 connecting the base of the transistor 30 to a bias voltage Vbias. The base is coupled via a capacitor 32 to a signal source comprising a voltage source providing a voltage Vs and a source impedance Rs.

The shot noise $V_{shot\ noise}$ is given by the expression:

$$V_{shotnoise} = 4KT \cdot \frac{(Rs + rbb + \text{Re})^2}{2\beta re} \quad (1)$$

where K is the Boltzmann constant, T is temperature in degrees Kelvin, β is the current gain of the transistor 30, re is the diode impedance of the transistor 30 and is equal to KT/q, where q is the charge on an electron, and rbb is the base spreading resistance of the transistor 30.

Figure 5:
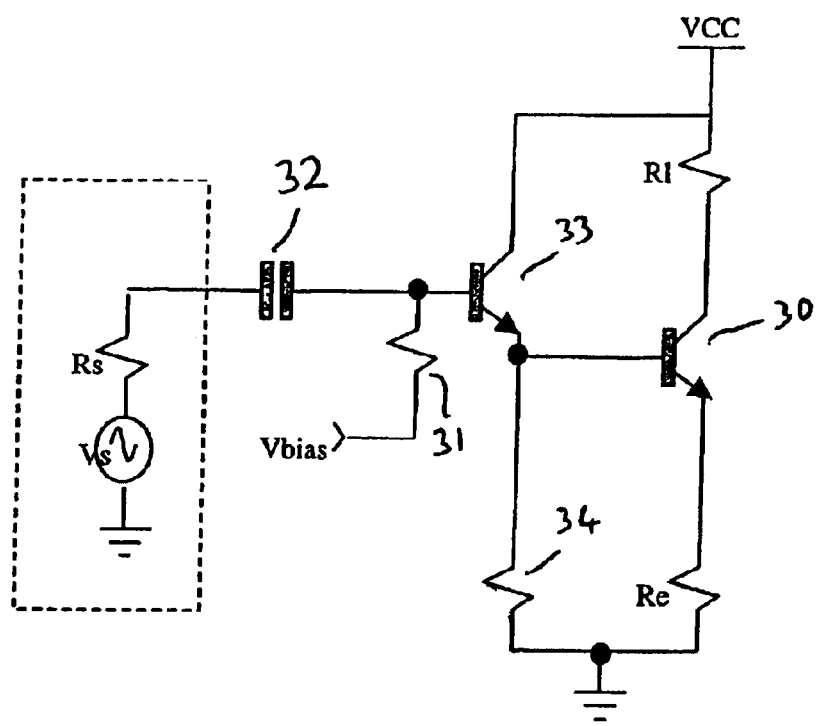

As re is reduced and for fixed values of Rs, rbb and Re, the shot noise term increases in magnitude. It is desirable to reduce the value of re because distortion is minimised by minimising the ratio Re/re. To reduce this term it is necessary to make β large or re large or a combination of the two. This may be achieved by introducing an emitter follower as shown in FIG. 5.

The emitter follower comprises a transistor 33 provided with an emitter resistor 34. The emitter of the transistor 33 drives the base of the transistor 30 directly whereas the base of the transistor 33 becomes the input connected to the signal source via the capacitor 32 and to receive the bias voltage via the resistor 31. The emitter follower thus buffers the base current of the transistor 30. Also, the transistor 33 may operate at a much lower current than the transistor 30. The effect of this is that the base current shot noise term is significantly reduced and this in turn means that the noise figure of the amplifier is substantially reduced.

Figure 6:
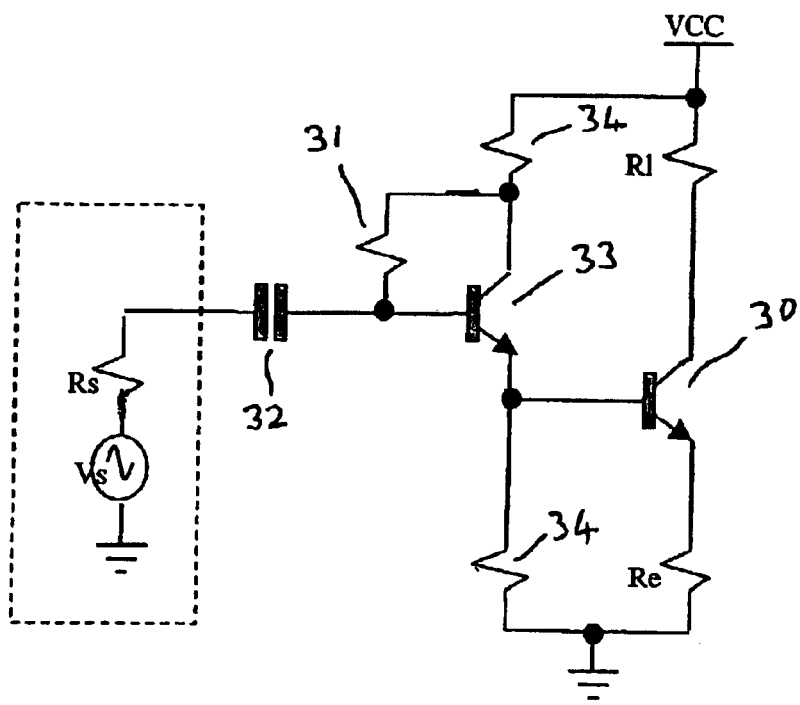

The value of the resistor 31 degrades the noise figure. The value of this resistor sets the input impedance of the amplifier in addition to biasing the amplifier. The value of the resistor 31 needs to be as high as possible to maximise noise figure but, if the input impedance needs to be set to a relatively low value, typically 75 ohms, there is a problem. However, this can be avoided by using the technique illustrated in FIG. 6, which uses the existing components to set the input impedance, provide bias and maximise the value of the resistor 31. The resistor 31 is connected between the base and collector of the transistor 33, which is provided with a collector resistor 34. The resistor 31 thus provides negative feedback in addition to biasing the base of the transistor 33. This allows the amplifier noise figure to be reduced.

Figure 7:
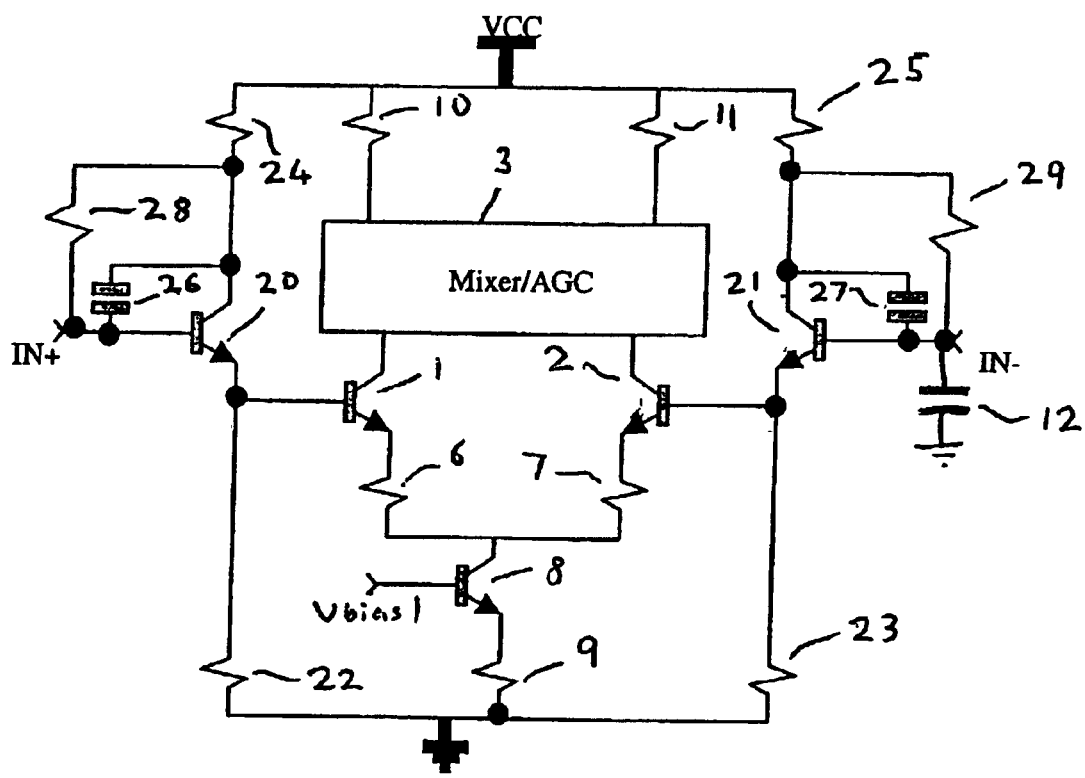
FIG. 7 is a circuit diagram of a radio frequency amplifier constituting a second embodiment of the invention.

FIG. 7 illustrates another radio frequency amplifier embodying all of the techniques described with reference to FIGS. 3 to 6. As compared with the amplifier of FIG. 3, the resistors 4 and 5 and the bias voltage Vbias 2 are omitted and feedback resistors 28 and 29 are connected between the base and collector of the transistors 20 and 21, respectively. This arrangement preserves the third harmonic distortion of the amplifier while reducing the noise figure and the second harmonic distortion arising from unbalanced driving of the amplifier. It is thus possible to provide an amplifier which is suitable, among other applications, for use as the first stage or front end of a television tuner, for example for receiving terrestrial signals or signals from a cable distribution network.

What is claimed is:

1. A radio frequency amplifier comprising: first and second inputs; a long tail pair of first and second transistors each of which has a base, an emitter, and a collector; a third transistor having a base connected to said first input of said amplifier and an emitter connected to said base of said first transistor; a fourth transistor having a base connected to said second input of said amplifier and an emitter connected to said base of said second transistor, said third and fourth transistors have first and second collector resistors, respectively; and first and second feedback resistors connected between said bases and collectors of said third and fourth transistors, respectively.

2. An amplifier as claimed in claim 1, in which said first and second transistors have first and second emitter resistors, respectively.

3. An amplifier as claimed in claim 1, in which said long tail pair comprises a common current source for said emitters of said first and second transistors.

4. An amplifier as claimed in claim 1, in which said third and fourth transistors have third and fourth emitter resistors, respectively.

5. An amplifier as claimed in claim 1, comprising first and second capacitors connected between said bases and collectors of said third and fourth transistors, respectively.

6. An amplifier as claimed in claim 1, comprising a capacitor connecting said second input of said amplifier to a ground.

7. An amplifier as claimed in claim 1, comprising a Gilbert cell connected to said collectors of said first and second transistors.

8. A television tuner comprising a radio frequency amplifier comprising: first and second inputs; a long tail pair of first and second transistors each of which has a base, an emitter, and a collector; a third transistor baying a base connected to said first input of said amplifier and an emitter connected to said base of said first transistor, a fourth transistor having a base connected to said second input of said amplifier and an emitter connected to said base of said second transistor, said third and fourth transistors have first and second collector resistors, respectively; and first and second feedback resistors connected between said bases and collectors of said third and fourth transistors, respectively.

* * * * *

UNITED STATES PATENT AND TRADEMARK OFFICE
CERTIFICATE OF CORRECTION

PATENT NO.    : 6,727,746 B2                                  Page 1 of 1
DATED         : April 27, 2004
INVENTOR(S)   : Arshad Madni et al.

It is certified that error appears in the above-identified patent and that said Letters Patent is hereby corrected as shown below:

Column 4,
Line 67, the word "baying" should be changed to -- having --.

Signed and Sealed this

Thirtieth Day of November, 2004

JON W. DUDAS
*Director of the United States Patent and Trademark Office*